United States Patent [19]

Olofsen

[11] 4,002,254

[45] Jan. 11, 1977

[54] METHOD AND A PICK-UP DEVICE FOR LIFTING AND MOVING SEMICONDUCTOR WAFERS

[75] Inventor: Oluf Per Olofsen, Roskilde, Denmark

[73] Assignee: Chemical Reactor Equipment A/S, Roskilde, Denmark

[22] Filed: Sept. 5, 1975

[21] Appl. No.: 610,713

[30] Foreign Application Priority Data

Sept. 6, 1974 Denmark ............................ 4728/74
Nov. 20, 1974 Denmark ............................ 6039/74

[52] U.S. Cl. .............................. 214/300; 214/152; 302/2 R; 294/64 B; 214/1 BS
[51] Int. Cl.² ..................................... B65G 65/04
[58] Field of Search ............... 214/1 BS, 1 BC, 300, 214/301, 16.4 R, 309, 1 R, 1 BS, 164 A, 152, 650 SG; 294/64 R, 64 A, 64 B; 302/2 R

[56] References Cited

UNITED STATES PATENTS

| | | | |
|---|---|---|---|
| 3,516,386 | 6/1970 | Landwehr et al. | 214/1 BC |
| 3,645,581 | 2/1972 | Lasch, Jr. et al. | 302/2 R |
| 3,822,025 | 7/1974 | Loos | 214/164 A |
| 3,902,618 | 9/1975 | Levy et al. | 214/301 |

OTHER PUBLICATIONS

IBM Technical Bulletin vol. 16 No. 2; July 1973.

*Primary Examiner*—Robert J. Spar
*Assistant Examiner*—R. B. Johnson
*Attorney, Agent, or Firm*—Sughrue, Rothwell, Mion, Zinn & Macpeak

[57] ABSTRACT

A method and a Bernoulli pick-up device for lifting and moving flat disc-shaped work pieces such as semiconductor wafers. The pick-up device has a working member the under side of which forms a flat suspension surface incorporating the orifice of a single inclined jet through which air is ejected in an unbalanced flow towards a limiting surface at one end of the suspension surface. In operation the working member is positioned over a wafer with the jet orifice separated a predetermined distance in front of the center of gravitation of the wafer whereby an initial drawing movement towards the limiting surface is impressed on the wafer. Wafers can be unloaded from a wafer magazine without any need of centering the suspension surface relative to the wafer. An improved magazine design makes it possible to unload wafers from arbitrary tracks independent of the presence of wafers in neighbor tracks.

20 Claims, 20 Drawing Figures

METHOD AND A PICK-UP DEVICE FOR LIFTING AND MOVING SEMICONDUCTOR WAFERS

The present invention relates to a method and a pick-up device for lifting and moving semiconductor wafers by utilizing the theoretically well known Bernoulli principle, according to which a disc-shaped and substantially flat work piece can be attracted without physical contact to a suspension surface incorporating the orifice of a jet through which an air flow is ejected which spread like a blanket in the space separating the suspension surface and the work piece, whereby a low pressure is created in said space, so that the work piece will be held attracted to the suspension surface as a result of the atmospheric pressure acting on the side of the work piece remote from the suspension surface.

In particular, the invention relates to the utilization of this technology in the loading and unloading of semiconductor wafers into and from a magazine, in which such wafers are arranged in parallel tracks separated by separation rails. Moreover, the invention relates to an improved magazine for semiconductor wafers for use together with a pick-up device of the kind referred to.

In a technological sense, the production of semiconductor devices is characterized by the use of a plurality of individual process steps in the form of chemical treatments, such as doping of impurities, etching, rinsing, etc., as well as operations of a physical nature, such as heating or radiation steps, photo lithographic masking steps, evaporation and spottering, etc. These processing steps are either carried out for batches of wafers, or for a continuous sequential flow of wafers. During the operations, a great number of identical components or circuit configurations are manufactured simultaneously on the same wafer, which may thereafter be cut into individual components or circuit configurations.

Since the process steps involved ate usually carried out under different environmental conditions and by use of different kinds of equipment, mechanical handling and transportation of the wafers play a very important role in the manufacture of semiconductor devices.

The mechanical handling and transportation operations are complicated by the fact that during many of the process steps the wafer will have to be positioned on a flat support with the side intended for receiving the desired treatment facing upwardly away from the support so as to be accessible to said treatment.

This particular side of a semiconductor wafer, i.e. the front side, will usually be very vulnerable to mechanical influences, such as contacting by different kinds of tools, and also to chemical attacks in the time intervals between the individual process steps. In particular, this will apply in the later stages of manufacture, in which the wafer substrate carries a thin film structure.

Hitherto, the usual tool for mechanical handling of semiconductor wafers has been ordinary tweezers designed to grip a wafer from both sides for lifting the wafer from one position and moving it to another. Thereby, the front side of the wafer will be subjected to a major risk of mechanical damage and chemical contamination. Furthermore, as a result of the fact that the surfaces of semiconductor wafer are very smooth, even a slight damage of the gripping surfaces of tweezers will imply a risk of dropping the wafer and, thus, the complete destruction thereof. Practical experience has shown that the handling of semiconductor wafers by means of tweezers will often result in a production loss, which may be as high as 35percent.

Likewise, the removal of semiconductor wafers from a wafer magazine, in which a plurality of wafers are arranged in parallel tracks by means of a pair of tweezers which are hand-held and not guided relative to the magazine, will subject the wafer to a major risk of breakage and damage due to the relatively narrow tracks, which leave only very little forced tilting of the wafers before breakage takes place.

To avoid the inherent disadvantages in the use of tweezers, it has been suggested to carry out the mechanical handling and transportation operations of semiconductor wafers by means of a vacuum sucking device with a mouth piece, which is brought into contact with the rear side of the wafer, which is not vulnerable to mechanical contact, whereby the wafer may be transported without contacting the front side. However, this suggestion has not found any practical application, owing to the fact that the rear side of the wafer will normally not be accessible for contact by such a mouth piece, since the wafer is normally resting either on a flat support with its rear side in contact therewith, or in a track in a magazine.

Therefore, owing to the great practical disadvantages of the known methods, a major interest has developed in recent years for utilizing the above mentioned Bernoulli principle for the lifting and moving of semiconductor wafers, since a wafer may then be lifted by means of a pick-up device facing the front side of the wafer.

A number of proposals have been made in the literature to solve the problems connected with the utilization of Bernoulli's principle. In most cases, these proposals have involved the use of a manually operated pick-up device having a flat working member, the underside of which forms a flat, usually circular suspension surface of an area corresponding to the magnitude of the wafers to be handled. The air flow serving to create the low pressure in the space between the wafer and the suspension surface neccessary for attracting the wafer is usually ejected symmetrically or balanced either through a single jet, the axis of which is perpendicular to the suspension surface in the center thereof, or through an annular slit concentric with the circumference of the suspension surface, or a number of jets, the orifices of which are located on a ring around the center of the suspension surface.

Pick-up devices of this kind have been suggested inter alia in U.S. Pat. Nos. 3,425,736, 3,431,009, 3,438,668 and 3,466,079, as well as in articles in the periodical IBM Technical Disclosure Bulletin, vol. 11, No. 2, July 1968, page 112, vol. 14, No. 8, January, 1972, pages 2311–2312 and vol. 15, No. 8, January 1973, pages 2556–2557.

These solutions have had in common that in practice they have found no application due to very great problems in obtaining a sufficient reliable holding of a wafer against lateral movement relative to the suspension surface and rotating movement around the center thereof. This will be readily understood when bearing in mind that the attachment of the wafer to the suspension surface is completely without friction, as a result of which even the slightest inaccuracy in the symmetrical ejection of the air flow will give rise to an unforeseen relative movement between the wafer and the suspension surface.

In itself, the lateral holding can normally be secured by providing the working member with guide means throughout the circumference of the suspension surface. However, the working member will then have to be centered accurately above a wafer to be lifted, which complicates the operation, and even by this measure no security against rotating movement of the wafer is obtained.

Therefore, in certain of the suggested solutions, a particular design of the semiconductor wafers to be used has been prescribed, such design incorporating for example a local cut in the circumference of the wafer for co-operation with a guide member depending from the suspension surface, such as mentioned in U.S. Pat. No. 3,523,706 and in IBM Technical Disclosure Bulletin, vol. 16, No. 7, December, 1973, page 2127, where, in addition to the balanced ejection of air, an extra unsymmetrical or unbalanced air flow is ejected through one or more jets, the orifices of which are displaced relative to the center of the suspension surface for the purpose of rotating the wafer until the notch or cut in the circumference thereof is caught by the guide member of the suspension surface. However, it will be readily understandable that a precondition involving one particular design of wafers will give a severe limitation of the practical applicability of the pick-up device, since semiconductor wafers are usually delivered in a standard design as circular discs having a single rectilinear cut on the circumference for indicating the orientation of the crystal axis in the monolitic semiconducture structure.

In U.S. Pat. No. 3,539,216, a pick-up device is disclosed, proposing the combination of balanced air ejection perpendicular to the suspension surface with an unbalanced air ejection through an inclined jet towards a pair of guide members arranged solely at one side of a delta-shaped suspension surface having an area substantially smaller than that of the wafers to be handled. In order to achieve a sufficient directional effect of such an inclined ejection when simultaneously a balanced ejection takes place, it is prescribed therein that the inclined ejection will have to take place under a narrow acute angle, preperably only 15° relative to the plan of the suspension surface, which requires a very great accuracy of manufacture, since the axis of the jet should, in addition, extend accurately in the symmetri plan of the guide members. Therefore, this solution will not give sufficient security against rotation of the wafer relative to the suspension surface and, furthermore, a single pair of guide members at one side only of the suspension surface will, in practice, be insufficient to secure the holding of the wafer against lateral movement. Moreover, as a result of the small area of the suspension surface, this pick-up device requires an air flow of a magnitude, which may in itself be harmful to the very brittle wafers. In addition, the suspension surface is still required to be accurately centered over a wafer to be lifted due to the balanced air ejection.

Thus, all the theoretically suggested solutions have in common that the suspension surface will have to be centered accurately over a wafer to be lifted. As a result thereof, these pick-up devices cannot be utilized for the loading and unloading of wafers from magazines of the kind, in which such wafers are usually held, since usual magazines do not allow introduction of the working member of a pick-up device to a sufficient depth to center the suspension surface accurately over a wafer to be unloaded, partly as a result of the fact that guide members depend from the suspension surface throughout the circumference thereof. This circumstance represents a severe bar to the practical applicability of such devices, since the loading and unloading of wafers into and from magazines are very frequent handling operations in the manufacture of semiconductors. In an article in IBM Technical Disclosure Bulletin, vol. 16, No. 2, July 1973, pages 427–428, a particular solution to remedy this disadvantage has been suggested, whereby a special loading and unloading holder, in which a pick-up device can be introduced to a sufficient depth, is coupled to the open front of a standard magazine. In advance of the unloading operation, wafers are held from the magazine to this holder, in which tracks are formed, which make continuations of the tracks of the magazine, by means of gravity. However, neither this solution, which implies a time consuming additional operation, has found much application in practice.

The object of the invention is to provide a method and a pick-up device for lifting and moving semiconductor wafers by utilization of the Bernoulli principle, in particular in the loading and unloading of such wafers into and from magazines of the kind referred to above, whereby the practical disadvantages of the prior art solution are remedied, so that wafers can be unloaded from magazines without being physically contacted and without coupling special accessories to the magazine.

Furthermore, it is intended to provide a simple pick-up device, which can without any difficulty be manufactured with an accuracy sufficient to secure reliable holding and lifting of a wafer and prevent it from leaving the suspension surface of the pick-up device in lateral directions, as well as from rotating around the center of the suspension surface.

A further object of the invention is to provide a pick-up device designed to be introduced in a magazine and having a holding ability sufficient to lift a wafer vertically out of a magazine.

In addition, the invention has for its object to provide an improved magazine design for use together with the suggested pick-up device, whereby to obtain a possibility for individual unloading of wafers from arbitrary tracks in a magazine for testing purposes, etc.

According to one aspect of the invention, a method for unloading individual semiconductor wafers from parallel tracks in a magazine is provided, wherein a working member of a pick-up device operating in accordance with the Bernoulli principle is introduced into the magazine with a suspension surface forming the underside of said working member facing a wafer to be unloaded within a prescribed maximum separation from said wafer, and an air flow is ejected through a jet orifice in said suspension surface for attracting the wafer to the suspension surface without physical contact, subsequent to which the pick-up device is retracted from the magazine, whereby the wafer is prevented from leaving the suspension surface in lateral directions, wherein the improvement comprises the steps of introducing said working member into the magazine to a depth of introduction only, at which said jet orifice is positioned at a predetermined distance in front of the center of gravitation of the wafer to be unloaded and ejecting a unidirectional air flow through said jet orifice in a symmetry plan perpendicular to the suspension surface and parallel to the unloading direction and under a predetermined angle relative to a normal to the suspension surface, whereby to move said wafer relative to the suspension surface towards guide means depending from said working member at the forward end of the suspension surface before retracting the pick-up device from the magazine.

By the ejection of such a unidirectional inclined air flow, it is obtained that the suspension surface need no longer be centered relative to the wafer arranged in a track of the magazine, since when the ejection of the air flow is started, the wafer will first be attracted to said guide means. In practice, it has appeared that the working member of the pick-up device need only be introduced into the magazine to a depth, at which the jet orifice is positioned over the wafer a small distance from the edge thereof facing the unloading opening of the magazine.

As a result of this drawing movement exerted on the wafer, a correct positioning thereof relative to the suspension surface is obtained right from the beginning, since the wafer is influenced by the unbalanced inclined air flow only. Of course, nothing could prevent the working member of the pick-up device from being introduced into the magazine to a depth, at which the wafer is completely covered by the suspension surface, provided the suspension surface has an extension leaving sufficient space for the initial drawing movement. However, in most standard magazines, this will not be possible, because the rear edges of the wafers are situated behind the bottom of the wafer tracks, where, in addition, the width as well as the depth of the tracks are reduced as a result of the fact that the bottom of the magazine is formed by bent-in edges of the side walls thereof. It is a particular advantage of the invention that it is possible to unload semiconductor wafers also from standard magazines of this kind.

The method according to the invention can be carried out by means of a pick-up device operating in accordance with the Bernoulli principle for lifting and moving a disc-shaped mechanically brittle work piece, in particular a semiconductor wafer, without physically contacting said work piece, comprising a handle, a working member connected with said handle and having an underside forming a suspension surface to be positioned over the surface of a work piece, an air jet having its orifice located on said suspension surface for ejecting an air flow to create a low pressure in the space separating the suspension surface from the work piece, and circumferential guide means depending from said suspension surface to prevent the work piece from leaving the suspension surface in lateral directions, wherein the improvement comprises that a single inclined air jet only has its orifice located in said suspension surface, the axis of said jet extending substantially in a symmetry plan perpendicular to the suspension surface and forming a predetermined angle with a normal to the suspension surface, said guide means including a protrusion forming a limiting surface at one end of said suspension surface, said limiting surface being intersected by said symmetry plan under a right angle, as well as guide means at the opposite end of said suspension surface, the axis of said inclined jet being directed towards said limiting surface, and the jet orifice being positioned on the suspension surface at such a location that the portion of the area of the suspension surface between said opposite end thereof and a line through the center of the jet orifice perpendicular to said symmetry plan corresponds to at least one third of the area of the surface a work piece to be lifted, which faces said suspension surface.

The application of this pick-up device is not per se limited to carrying the method according to the invention, since the device may also be used for lifting a wafer from a flat support, such as a table.

When used together with a magazine, the pick-up device may comprise longitudinal guide means extending on said working member parallel to said symmetry plan to allow introduction of said working member to a predetermined depth into a magazine incorporating parallel tracks for semiconductor wafers separated by separation rails and within a prescribed maximum separation of said suspension surface from a wafer positioned in one of said tracks.

In connection therewith, it can be made possible to unload wafers individually from arbitrary tracks in a magazine independent of the presence of wafers in the neighbour tracks. According to a further aspect of the invention, this can be obtained by means of a magazine for semiconductor wafers, comprising a plurality of parallel tracks, which are open at one end and separated by separation rails formed at the inner sides of two opposite, substantially parallel side walls, and being adapted for use in co-operation with a pick-up device of the kind referred to, wherein the improvement comprises that the mutual separation between said tracks exceeds the thickness of the working member of said pick-up device to an extent allowing introduction of said working member between neighbour tracks of the magazine to said predetermined depth without physical contact between the working member and wafers arranged in such neighbour tracks, guide members being formed at said opposite side walls of the magazine between the tracks to match the longitudinal guide means of the pick-up device.

In the following, the invention will be explained in further detail with reference to the drawings, in which.

Figure 2:
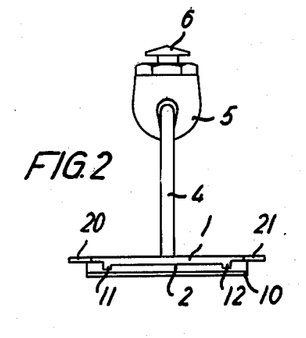
Figure 3:
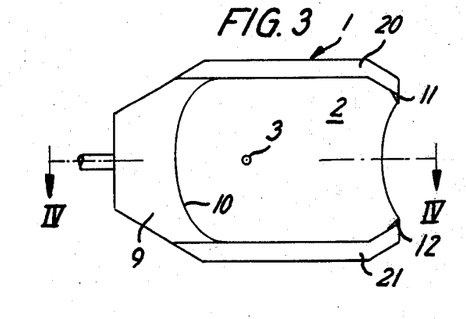
FIG. 3 shows a working member of the pick-up device of FIGS. 1 and 2, in an underneath view.
Figure 4:
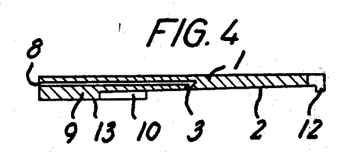
FIG. 4 is a longitudinal sectional view of the working member along the line IV—IV in FIG. 3.

The embodiment of a pick-up device according to the invention, shown in FIGS. 1 to 4, comprises in a matter known per se a working member designated as a whole by 1, the underside of which forms a suspension surface for flat, disc-shaped work pieces, such as semiconductor wafers, which should be able to be lifted and moved by means of the pick-up device without being physically contacted, by the ejection of an air flow through a jet 3, the orifice of which is located in the suspension surface 2, such as shown in FIG. 4, which air flow will spread like a blanket and thereby create a low pressure in the space separating the suspension surface and a disc-shaped work piece positioned close thereto. As it will appear from FIGS. 1 and 2, the supply of air to jet 3 takes place through a pipe connection 4 and a handle 5 incorporating a manually operable valve 6 to open and close the supply of air, the handle 5 having a connection member 7 for a hose connection, not shown, leading to an air supply. Inside working member 1, the air flow is conveyed to jet 3 through a duct 8.

In accordance with the invention, only a single inclined jet 3 has its orifice located in the suspension surface 2 of working member 1, the axis of said jet extending substantially in a symmetry plan perpendicular to the suspension surface 2, i.e. corresponding to the plan of the drawing in FIG. 4, and forming a predetermined angle with a normal to the plan of the suspension surface.

In order to prevent a work piece attracted to the suspension surface 2 from leaving the suspension surface in lateral directions the working member 1 is provided with guide means depending from the suspension surface 2, said guide means comprising, according to the invention, on one hand a protrusion 9 perpendicular to the suspension surface 2, said protrusion forming at one end of the suspension surface a limiting surface 10, which is intersected by the above mentioned symmetry plan under a right angle and, on the other hand, guide members 11 and 12 at the opposite end of the suspension surface 2, which in the embodiment shown are substantially punctual. The axis of the inclined jet 3 is directed towards the limiting surface 10, and the orifice of jet 3 has such a location in the suspension surface 2 that the part of the area of the suspension surface extending between the jet orifice and guide members 11 and 12 correspond to at least one third of the area of a disc-shaped work piece to be lifted by the pick-up device.

When lifting a disc-shaped work piece, such as a semiconductor wafer, by means of the pick-up device shown in FIGS. 1 to 4, the working member 1 is moved over the wafer until the orifice of jet 3 is positioned at a predetermined distance in front of the center of gravitation of the wafer. When the air ejection through jet 3 is then started, the wafer will first be drawn by the unidirectional air flow towards the limiting surface 10, whereby right from the beginning the wafer is correctly positioned relative to the suspension surface, so that during the subsequent lifting under continued air ejection through jet 3, the wafer will be held against lateral movement relative to the suspension surface 2, as well as rotation around the center thereof.

In order to achieve this effect, the air ejection through jet 3 should be able, on one hand, to produce the initial drawing movement and, on the other hand, subsequent to this movement to give a reliable attraction of the wafer to the suspension surface 2 in accordance with the Bernoulli principle.

Within certain limits, it is possible to vary the parameters determining the drawing and holding ability, i.e. the inclination of jet 3 relative to suspension surface 2, defined by the angle between the jet axis and a normal to the plan of the suspension surface and the initial distance between the orifice of jet 3 and the center of gravitation of the wafer to be lifted. Practical experiments have shown that the jet angle should preferably be between 20° and 50°, and the initial distance between 15 and 48 percent of the smallest width dimension of the wafer, said dimension being somewhat smaller than the diameter of the circular part of the wafer, owing to the presence of a rectilinear cut of the circumference of the wafer referred to in the foregoing.

In the embodiment shown in FIG. 1 to 4, the major weight is attached to obtaining a high drawing ability corresponding to a relatively great initial distance between the orifice of jet 3 and the center of gravitation of the wafer, said distance being, for example, 48 percent of said smallest width dimension of the wafer. In order to obtain this, the angle between the axis of jet 3 and the normal to the plan of suspension surface 2 has been selected to 45°.

As a result of the relatively great initial distance, a possibility is obtained for a relatively long drawing movement and, thus, for the lifting of a wafer, which initially is situated outside the working member with part of its area. In connection therewith, measures have been taken in this embodiment to avoid physical contact between the wafer and the guide members 11 and 12 during this drawing movement. Thus, protrusion 9 forms perpendicular to limiting surface 10 an abutment face 13 at a distance from the plan of suspension surface 2 corresponding to the prescribed maximum separation between suspension surface 2 and a wafer to be lifted from a flat support contact by abutment face 13, and the plan of suspension surface 2 is inclined upwardly relative to abutment face 13, so that guide members 11 and 12 are lifted from the flat support. A further security for allowing the passage of the wafer under guide members 11 and 12 without being physically contacted is obtained as a result of the fact that the height of said guide members from the plan of the suspension surface is lower than that of protrusion 9, said height being sufficient, of course, to secure the lateral restriction of the possibilities of movement of the wafer attracted to suspension surface 2.

On account thereof, the embodiment shown in FIGS. 1 to 4 is well suitable for lifting a wafer positioned on a flat support, such as a table, since the prescribed separation between suspension surface 2 and the wafer is determined in advance when positioning the working member 1 with abutment face 13 in contact with said flat support.

Figure 5:
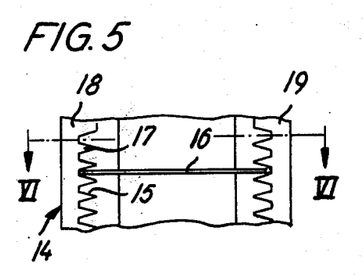
FIG. 5 is a front view of a portion of a magazine for semiconductor wafers.
Figure 6:
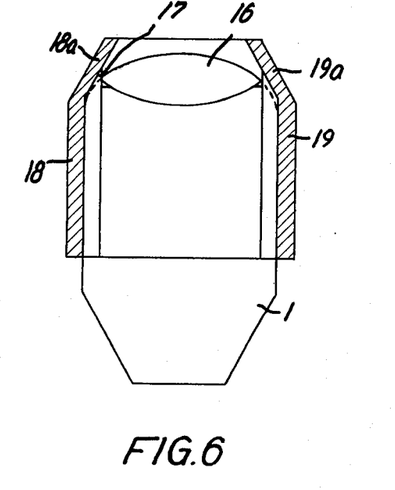
FIG. 6 is a cross sectional view of the magazine along the line VI—VI in FIG. 5.

However, in addition thereto, this embodiment is particularly suitable for loading and unloading wafers into and from a standard magazine for such wafers of the kind shown in FIGS. 5 and 6. This magazine, which is designated as a whole by 14, comprises a plurality of parallel tracks 15 for the arrangement of individual wafers of which one is shown at 16, said tracks being separated by separation rails 17 formed at the inner sides of two opposite, substantially parallel side walls 18 and 19 of the magazine. For the purpose of being applicable as a holder for wafers during certain process steps, magazine 14 is open, not only at the front side, at which wafers 16 may be unloaded from the magazine, but also at the rear side or the bottom, wafers 16 being prevented from leaving the magazine to this side by bent-in edges 18a and 19a of side walls 18 and 19, respectively. As a result of this design, both the width and the depth of tracks 15 wil, however, be reduced towards the rear end of the magazine, whereby the possible depth of introduction of the working member of a pick-up device will be restricted to an extend excluding the application of the prior art pick-up devices, where the suspension surface will have to be accurately centered over a wafer to be moved.

Figure 1:
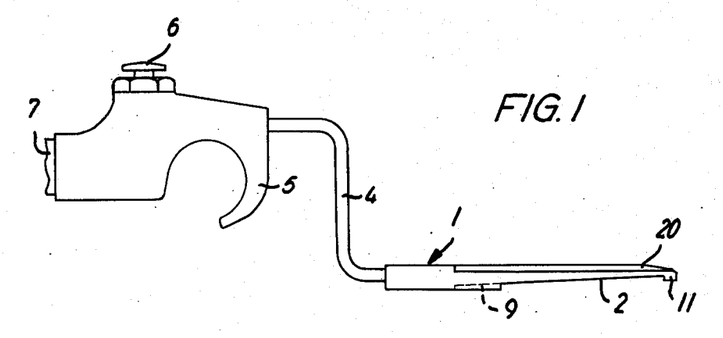
FIGS. 1 and 2 show one embodiment of a pick-up device according to the invention, in a side view and an end view, respectively.
Figure 7:
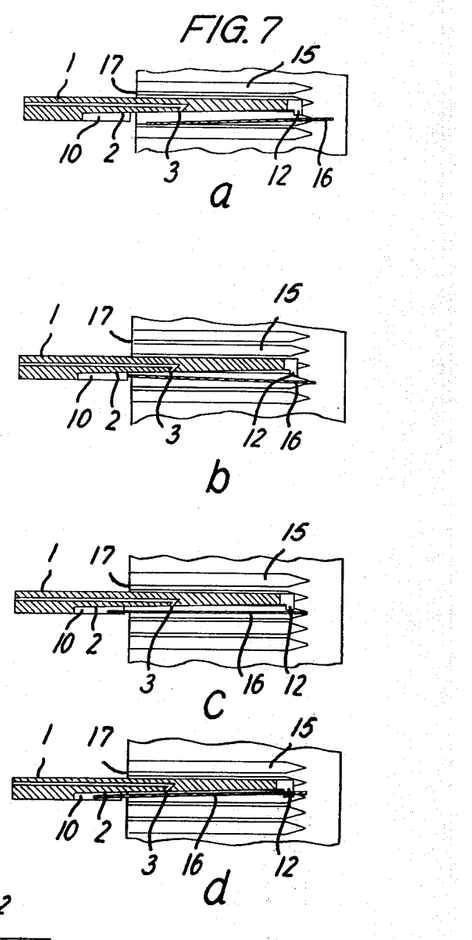
FIGS. 7a–7d show various phases during the unloading of a semiconductor wafer from a magazine as shown in FIGS. 5 and 6, by means of a pick-up device as shown in FIGS. 1 to 4.

By means of the embodiment of the pick-up device according to the invention shown in FIGS. 1 to 4, it is possible without difficulty to unload wafers as shown at 16 from a standard magazine of the kind shown in FIGS. 5 and 6. This unloading operation is further shown in FIG. 7, illustrating at a–d four phases in the unloading of a wafer. For the purpose of being introduced in the tracks 15 of magazine 14, working member 1 of the pick-up device is provided with longitudinal guide means extending parallel to the symmetry plan, said guide means being constituted in the present embodiment by guide fins 20 and 21 extending along two opposite sides of working member 1, such as shown in FIGS. 1 to 3. As illustrated schematically in FIG. 6, the working member 1 can be introduced by means of said guide fins in the track of magazine 14 extending immediate above the wafer 16 to be unloaded, provided no wafer is present in said track. As it would appear from the phases illustrated in FIG. 7, the wafer 16 will, in the initial phase of the unloading movement, be moved without physical contact past the guide members 11 and 12 as a result of the design of working member 1 with an inclined suspension surface 2 and a relatively low height of said guide members 11 and 12, since simultaneously with the attraction of wafer 16 towards limiting surface 10 caused by the air ejection through jet 3, the forward end of wafer 16 will be lifted toward the suspension surface 2, so that the wafer is made to perform a tilting movement in track 15, whereby the rear end of the wafer will get rid of guide members 11 and 12. During the subsequent phases, the drawing movement is continued, and when the wafer has been drawn into position in the direction towards the limiting surface 10 also the rear end will be lifted to be positioned between guide members 11 and 12, as shown in FIG. 3.

Figure 8:
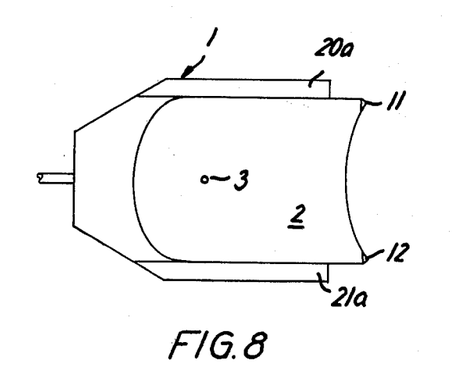
FIG. 8 shows the working member only at a further embodiment of a pick-up device according to the invention.
Figure 9:
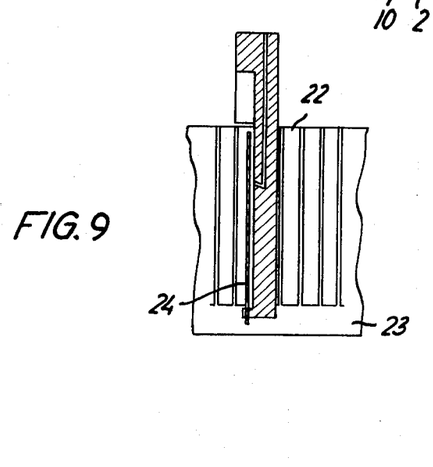
FIG. 9 shows a portion of another type of magazine for semiconductor wafers to illustrate the co-operation between such a magazine and the pick-up device illustrated in FIG. 8.

In case of other magazine types having parallel side walls, where the width and the depth of each track are constant throughout the length of the track, the pick-up device according to the invention can be provided as shown in FIG. 8 with guide fins 20a and 21a of shorter length, so that guide members 11 and 12 when introducing working member 1 in a track 22 of such a magazine 23 will be positioned behind the rear end of a wafer, as shown at 24 in FIG. 9. Bearing in mind that the suspension surface of working member 1 should still have a form so as to allow sufficient space for the initial drawing movement, whereby the wafer is correctly positioned relative to the suspension surface, sufficient drawing ability to force the wafer against limiting surface 10 may in this embodiment be obtained be selecting the angle between the axis of jet 3 and the normal to suspension surface 2 to a smaller magnitude, for example 22°, than in the previous embodiment shown in FIGS. 1–4. As schematically illustrated in FIG. 9, it will hereby be possible to unload wafers from a magazine in the vertical direction.

Whereas the embodiments of the pick-up device described so far would make it possible solely to unload wafers from a magazine successively from one end of the magazine to the other owing to the fact that introduction of working member 1 is subject to the condition that a free track is available in the magazine immediately above the track accommodating the wafer to be unloaded, it can also be made possible according to a particular aspect of the invention to unload a wafer from any arbitrary position in a magazine independent of the presence of wafers in the neighbour tracks by providing the magazine with introduction guide members co-operating with the guide means on the working member of the pick-up device in such a way that the working member may be introduced between two neighbour tracks without physical contacting wafers in any of these tracks. In FIGS. 1o to 18 a number of examples of such co-operating combinations of a working member and a magazine are shown.

Figure 10:
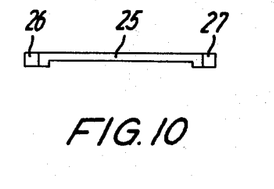
FIG. 10 is a cross sectional view of the working member only of a third embodiment of a pick-up device according to the invention.
Figure 11:
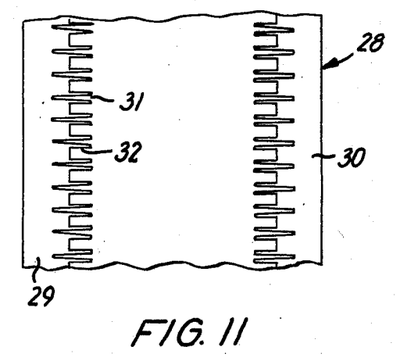
FIG. 11 shows one embodiment of a magazine according to the invention for use together with a working member as shown in FIG. 10.

Thus, FIG. 10 is a cross-sectional view of an embodiment of a working member 25, in which the guide means are constituted by guide fins 26 and 27 having a thickness exceeding that of the previous embodiments, said thickness exceeding the width of the tracks in the magazine 28 shown in FIG. 11, in which working member 25 should be introduced. At the inner side of side walls 29 and 30 of magazine 28, in addition to wafer tracks 31, guide grooves 32 are formed between said tracks, said guide grooves having a width corresponding to the thickness of guide fins 26 and 27 in FIG. 10. Thereby, working member 25 with guide fins 26 and 27 may be introduced only in said guide grooves 32, but not in tracks 31.

Figure 12:
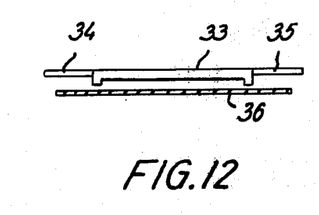
FIGS. 12 and 13 show a cross sectional view of the working member only of a further embodiment of the pick-up device and a portion of a further embodiment of the magazine according to the invention for use together with said working member, respectively.
Figure 13:
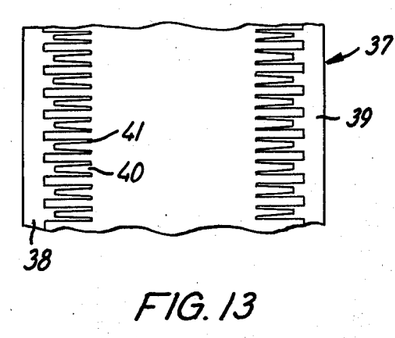

In the embodiment shown in FIG. 12 working member 33 of the pick-up device has such proportions that the width of guide fins 34 and 35 exceeds the depth of the tracks of the magazine in which the working member is to be introduced. At the inner sides of walls 38 and 39 of a corresponding magazine 37 shown in FIG. 13 guide grooves 41 are formed between tracks 40, said guide grooves having a depth exceeding that of the tracks. Thus, also in this embodiment erroneous introduction of the working member is prevented, since the guide fins thereof cannot be introduced into the tracks of the magazine.

Figure 14:
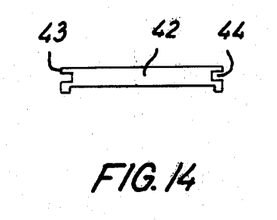
FIGS. 14 to 18 show further examples of working members and magazine embodiments for co-operation therewith.
Figure 15:
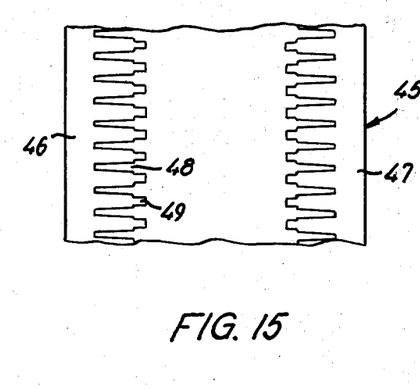

As further illustrated in FIGS. 14 and 15 the relative guidance between working member and magazine may alternatively be obtained by forming the guide means on working member 42 as guide grooves 43 and 44 and the guide means of magazine 45 as guide rails 49 formed at the inner side of walls 46 and 47 between tracks 48.

Figure 16:
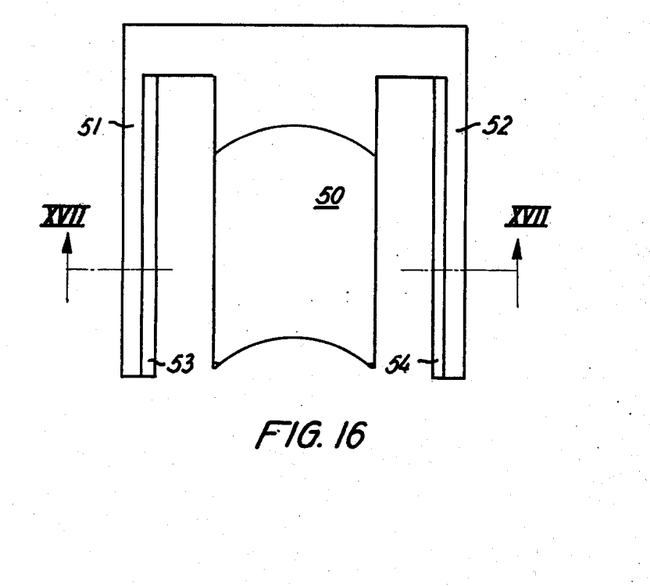
Figure 17:
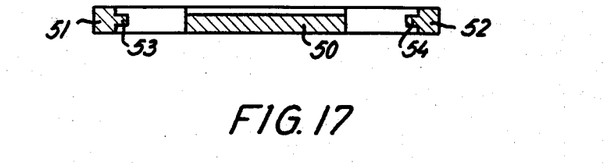
Figure 18:
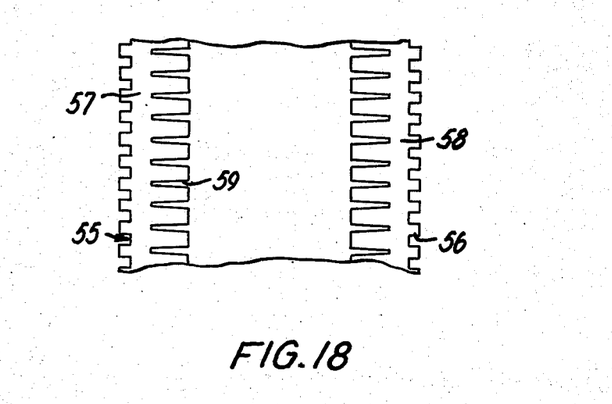

As finally illustrated in FIGS. 16–18 the guide means of the magazine need not be formed at the inner side of the walls. In this example the pick-up device has been provided with arms 51 and 52 extending parallel to working member 50 on each side thereof. When introduced into the magazine 55 shown in FIG. 18 the working member is guided by means of guide fins 53 and 54 formed on the inner side of arms 51 and 52 facing working member 50, said guide fins fitting in guide grooves 56 formed at the outer side of walls 57 and 58 of magazine 55 and correctly positioned relative to tracks 59.

What is claimed is:

1. A method for unloading individual semiconductor wafers from parallel tracks in a magazine, wherein a working member of a pick-up device operating in accordance with the Bernoulli principle is introduced into the magazine with a suspension surface forming the underside of said working member facing a wafer to be unloaded within a prescribed maximum separation from said wafer, and an air flow is ejected through a jet orifice in said suspension surface for attracting the wafer to the suspension surface without physical contact, subsequent to which the pick-up device is retracted from the magazine, whereby the wafer is prevented from leaving the suspension surface in lateral directions, wherein the improvement comprises the steps of introducing said working member into the magazine to a depth of introduction only, at which said jet orifice is positioned at a predetermined distance in front of the center of gravitation of the wafer to be unloaded and ejecting a unidirectional air flow through said jet orifice in a symmetry plan perpendicular to the suspension surface and parallel to the unloading direction and under a predetermined angle relative to a normal to the suspension surface, whereby to move said wafer relative to the suspension surface towards guide means depending from said working member at the forward end of the suspension surface before retracting the pick-up device from the magazine.

2. A method as claimed in claim 1, wherein said predetermined distance is between 15 and 48 percent of the smallest width dimension of said wafer, and said predetermined angle is between 20° and 50°.

3. A method as claimed in claim 2, wherein said predetermined distance is 48 percent of the smallest width dimension of said wafer, and said predetermined angle is 45°.

4. A method as claimed in claim 3, wherein said predetermined distance is substantially one sixth of the smallest width dimension of said wafer, and said predetermined angle is substantially 22°.

5. A pick-up device operating in accordance with the Bernoulli principle for lifting and moving a disc-shaped mechanically brittle work piece, in particular a semiconductor wafer without physically contacting said work piece, comprising a handle, a working member connected with said handle and having an underside forming a suspension surface to be positioned over the surface of a work piece, an air jet having its orifice located on said suspension surface for ejecting an air flow to create a low pressure in the space separating the suspension surface from the work piece and circumferential guide means depending from said suspension surface to prevent the work piece from leaving the suspension surface in lateral directions, wherein the improvement comprises that a single inclined air jet only has its orifice located in said suspension surface, the axis of said jet extending substantially in a symmetry plan perpendicular to the suspension surface and forming a predetermined angle with a normal to the suspension surface, said guide means including a protrusion forming a limiting surface at one end of said suspension surface, said limiting surface being intersected by said symmetry plan under a right angle, as well as guide means at the opposite end of said suspension surface, the axis of said inclined jet being directed toward said limiting surface, and the jet orifice being positioned on the suspension surface at such a location that the portion of the area of the suspension surface between said opposite end thereof and a line through the center of the jet orifice perpendicular to said symmetry plan corresponds to at least one third the area of the surface of a work piece to be lifted which faces said suspension surface.

6. A pick-up device as claimed in claim 5, wherein said protrusion forms a flat abutment face perpendicular to said limiting surface at a distance from said suspension surface corresponding to a prescribed maximum separation between said suspension surface and a work piece resting on a flat support contacted by said abutment face.

7. A pick-up device as claimed in claim 6, wherein said suspension surface inclines upwardly from said protrusion relative to said abutment face so as to lift the guide means at said opposite end of said suspension surface from a flat support contacted by said abutment face.

8. A pick-up device as claimed in claim 7, wherein the height of said guide means from the suspension surface is lower than that of said protrusion in order to secure free passage without physical contact with said guide means for a work piece resting on a flat support contacted by said abutment face.

9. A pick-up device as claimed in claim 5, wherein said predetermined angle is between 20° and 50°.

10. A pick-up device as claimed in claim 9, wherein said predetermined angle is 45°.

11. A pick-up device as claimed in claim 9, wherein said predetermined angle is substantially 22°.

12. A pick-up device as claimed in claim 5, further comprising longitudinal guide means extending on said working member parallel to said symmetry plan to allow introduction of said working member to a predetermined depth into a magazine incorporating parallel tracks for semiconductor wafers separated by separation rails and within a prescribed maximum separation of said suspension surface from a wafer positioned in one of said tracks.

13. A pick-up device as claimed in claim 12, wherein said longitudinal guide means are constituted by guide fins extending along two opposite sides of said working member and having a form fitting the wafer tracks of the magazine.

14. A magazine for semiconductor wafers comprising a plurality of parallel tracks, which are open at one end and separated by separation rails formed at the inner sides of two opposite, substantially parallel side walls and being adapted for use in co-operation with a pick-up device as claimed in claim 12, wherein the improvement comprises that the mutual separation between said tracks exceeds the thickness of the working member of said pick-up device to an extent allowing introduction of said working member between neighbour tracks of the magazine to said predetermined depth without physical contact between the working member and wafers arranged in such neighbour tracks, guide members being formed at said opposite side walls of the magazine between the tracks to match the longitudinal guide means of the pick-up device.

15. A pick-up device as claimed in claim 12, wherein said guide means are constituted by guide fins having a thickness exceeding the width of the tracks of said magazine.

16. A magazine as claimed in claim 14 for use in co-operation with a pick-up device as claimed in claim 15, wherein said guide members are constituted by grooves formed in said separation rails parallel to said tracks and having a width exceeding that of the tracks and a depth smaller than that of the tracks.

17. A pick-up device as claimed in claim 12, wherein said guide means are constituted by guide fins, the width of which exceeds the depth of the tracks of said magazine.

18. A magazine as claimed in claim 14 for use in co-operation with a pick-up device as claimed in claim 17, wherein said guide members are constituted by grooves formed in said separation rails parallel with the tracks and having a depth exceeding that of the tracks.

19. A pick-up device as claimed in claim 12, wherein said guide means are formed on the inner sides of outer arms extending parallel to said working member separated from opposite sides thereof.

20. A magazine as claimed in claim 14 for use in co-operation with a pick-up device as claimed in claim 19, wherein said guide members are formed on the outer sides of said opposite side walls.

* * * * *